United States Patent [19]

Kawasaki et al.

[11] Patent Number: 5,605,860
[45] Date of Patent: Feb. 25, 1997

[54] METHOD OF FABRICATING SEMICONDUCTOR THIN FILM AND METHOD OF FABRICATION HALL-EFFECT DEVICE

[75] Inventors: Tetuo Kawasaki, Katano; Tetuhiro Koretika, Hirakata; Makoto Kitabatake, Nara; Takasi Hirao, Moriguchi, all of Japan

[73] Assignee: Matsushita Electric Industrial Co., Ltd., Osaka, Japan

[21] Appl. No.: 374,207

[22] Filed: Jan. 18, 1995

Related U.S. Application Data

[63] Continuation of Ser. No. 247,655, May 23, 1994, Pat. No. 5,385,864.

[30] Foreign Application Priority Data

May 28, 1993 [JP] Japan ................................. 5-126926
Jun. 18, 1993 [JP] Japan ................................. 5-147422
Jan. 18, 1994 [JP] Japan ..................................... 6-3462

[51] Int. Cl.[6] .......................................................... H01L 21/20
[52] U.S. Cl. .......................... 437/126; 437/129; 437/132; 437/133
[58] Field of Search ............................... 437/126, 129, 437/132, 133; 134/1.1

[56] References Cited

U.S. PATENT DOCUMENTS 5,221,637  6/1993  De Boeck ................................ 437/132
5,252,181 10/1993  Dutartre et al. .......................... 134/1.1
5,275,687  1/1994  Choquette et al. ....................... 134/1.1
5,356,509 10/1994  Terramoua et al. ..................... 437/132

FOREIGN PATENT DOCUMENTS 2-72616  3/1990  Japan.

OTHER PUBLICATIONS

Konno et al., "New InSb and GaAs Fabrication Techniques Yield Better, Cheaper Hall Element," *Journal of Electronic Engineering*, Oct., 1975, vol. 107, pp. 24–28.

Chyi et al., "Molecular Beam Epitaxial Growth and Characterization of InSb on Si," *Applied Physics Letters*, vol. 54, No. 11, Mar. 13, 1989, pp. 1016–1018.

*Primary Examiner*—Robert Kunemund
*Attorney, Agent, or Firm*—Beveridge, DeGrandi, Weilacher & Young, L.L.P.

[57] ABSTRACT

A method of fabricating a semiconductor thin film is initiated with preparing a substrate having a surface consisting of a single crystal of Si. The surface has an oxide film. Then, the oxide film is removed. The dangling bonds of the Si atoms on the surface are terminated with hydrogen atoms. An initial layer is formed on the substrate of the single crystal of Si terminated with the hydrogen atoms, of at least one selected from the group consisting of Al, Ga, and In. A buffer layer containing at least In and Sb is formed on the initial layer. A semiconductor thin film containing at least In and Sb is formed on the buffer layer at a temperature higher than the temperature at which the buffer layer is started to be formed. There is also disclosed a method of fabricating a Hall-effect device. This method is initiated with forming a semiconductor thin film by making use of the above-described fabrication method. Then, electrodes are attached to the thin film.

15 Claims, 8 Drawing Sheets

1. Substrate
2. Initial Layer
3. Buffer Layer
4. Semiconductor Thin Layer

5: Electrodes

METHOD OF FABRICATING SEMICONDUCTOR THIN FILM AND METHOD OF FABRICATION HALL-EFFECT DEVICE

This is a continuation of application Ser. No 08/247,655 filed on May 23, 1994, now U.S. Pat. No. 5,385,864 which application is entirely incorporated herein by reference.

BACKGROUND OF THE INVENTION

1. Field of the Invention

The present invention relates to a method of fabricating a semiconductor thin film adapted to be used as a Hall-effect device which is used to detect rotations, displacements, and other motions.

2. Description of the Related Art

Hall-effect devices using semiconductors have several advantages. For example, they have excellent frequency characteristics, are capable of noncontacting-type detection, and are insusceptible to noise. They have been used principally as noncontacting-type rotational number-detecting sensors and have found wide application. Among them, a Hall-effect device using indium antimonide (InSb) which is a semiconductor having the greatest electron mobility produces a large output signal. Moreover, a wide gap can be secured between this Hall-effect device and a sample to be investigated. Hence, this device is most suited for a rotational number-detecting and displacement-detecting sensor. Hall-effect devices using InSb include magneto-resistors and Hall generators. The prior art techniques are described below in further detail, using the magneto-resistors.

Conventional InSb magneto-resistors are classified into the bulk type and the thin-film type, according to the fabrication process. The bulk type is fabricated by bonding a single bulk crystal to the top surface of a support substrate with adhesive, polishing the crystal into a thin leaf, and machining or processing the leaf. In this structure, the electron mobility has the greatest values of 5 to 8 $m^2$/V s at room temperature because of the use of a single bulk crystal. Also, this bulk-type structure produces a large output signal. However, it is not easy to handle this device because the electron mobility depends heavily on temperature. Another problem is that the InSb thin film cracks due to a difference in coefficient of thermal expansion between the adhesive layer and the InSb at elevated temperatures. Therefore, the operating temperature of the device is restricted to the range from approximately −20° C. to +80° C. In high-temperature applications, for example in automobile applications where the used temperature range is between −50° C. and +150° C., the device lacks reliability and hence is not used.

On the other hand, the latter thin-film type is fabricated by a vacuum process such as vacuum evaporation techniques. In particular, a thin film of InSb is formed on a substrate by a vacuum process and then the film is machined or processed. The device fabricated by this method is inferior in electron mobility to a single bulk crystal because of grain boundaries and dislocations existing inside the film but the temperature-dependence is milder and so the thin-film type device can be easily handled. Furthermore, there is a possibility that reliability is secured in high-temperature applications, since the thin film of InSb is directly formed on the substrate. In addition, the thin-film type device can be made thinner than the bulk type. This makes it easy to increase the resistance of the device. In consequence, low electric power consumption and miniaturization can be accomplished.

In the thin-film type, however, the used substrate plays an important role. As an example, where an In Sn film is formed on a substrate whose surface is amorphous such as a glass substrate, the obtained film is polycrystalline. The electron mobility is 2 to 3 $m^2$/V s at best, and the output signal from this device is small. Fukunaka and others have obtained an electron mobility comparable to that of a single crystal by the use of a substrate of cleaved mica (Technical Report of Toyo Tsushin-ki, No. 40, (1987)). In this method, however, the adhesiveness between an InSb thin film and mica substrate is bad. Thus, it is necessary to transfer the InSb thin film to another support substrate via an adhesive layer. For this reason, the usable temperature range is restricted to a range similar to the range for the bulk type. Other known techniques utilize molecular beam epitaxy to epitaxially grow an InSb film on a substrate made of CdTe, sapphire, $BaF_2$, GaAs, or other material. Unfortunately, this substrate is very expensive.

Chyi and others produced a thin film of InSb having an electron mobility of 3.9 $m^2$/V s on a substrate of a relatively cheap, silicon (Si) single crystal by molecular beam epitaxy (J.-I. Chyi et al., Appl. Phys. Lett., 54, 11 (1989)). However, this method needs a manufacturing step where the Si surface is maintained above 900° C. under an ultrahigh vacuum (normally below $10^{-7}$ Pa) to remove the oxide film on the surface of the Si. It is not easy to use this step in the manufacturing process. In this way, with the thin film type, any method of forming a thin film of InSb having a high electron mobility directly on a substrate at low cost is not available and so the thin-film type has not enjoyed wide acceptance.

SUMMARY OF THE INVENTION

It is an object of the present invention to provide a method of fabricating a semiconductor thin film showing sufficiently high reliability even in high-temperature applications by forming an InSb thin film having an electron mobility comparable to that of the bulk type directly on a substrate at low cost.

It is another object of the invention to provide a method of fabricating a Hall-effect device showing sufficiently high reliability even in high-temperature applications by forming an InSb thin film having an electron mobility comparable to that of the bulk type directly on a substrate at low cost.

The above objects are achieved in accordance with the teachings of the invention by a method of comprising the steps of: preparing a substrate having a surface consisting of a single crystal of Si; removing an oxide film from the surface of the substrate and terminating dangling bonds of Si atoms on the surface with hydrogen atoms; forming an initial layer on the substrate of the single crystal of Si terminated with the hydrogen atoms out of at least one selected from the group consisting of aluminum (Al), gallium (Ga), and indium (In); forming a buffer layer containing at least In and Sb on the initial layer; and forming a semiconductor thin film containing at least In and Sb on the buffer layer at a temperature higher than a temperature at which the buffer layer is started to be formed.

Preferably, the temperature at which the buffer layer is formed is lowered with increasing the layer thickness.

Also, the invention provides a method of fabricating a Hall-effect device by machining or processing a semiconductor thin film fabricated by the method described above and attaching electrodes to the thin film.

In the structure described above, the hydrogen atoms prevent the Si surface terminated with hydrogen atoms from being oxidized. As a result, the surface is maintained stably. Then, the initial layer consisting of Al, Ga, or In is formed. This permits the following buffer layer to grow into a smooth and large crystal. Also, the crystal is an epitaxially grown film having the same crystallographic orientation as that of the Si substrate. Subsequently, the semiconductor film is started to be formed at the temperature higher than the starting fabrication temperature of the buffer layer. Consequently, the buffer layer mitigates the differences in lattice mismatch and coefficient of thermal expansion between the substrate and the semiconductor thin film. Moreover, the crystal growth rate of the semiconductor thin film is increased. Hence, an epitaxially grown thin film of semiconductor is obtained which shows high crystallinity and in which individual crystals are bonded together. Especially, the lattice mismatch with the substrate can be reduced further by lowering the fabrication temperature of the buffer layer with increasing the layer thickness and then elevating the fabrication temperature to the temperature at which the semiconductor thin film is formed. This further enhances the crystallinity of the semiconductor thin film.

As described thus far, a crystal of good quality can be directly formed on the substrate and so the adhesiveness between the crystal and the substrate is good. A thin film of semiconductor which exhibits stability at elevated temperatures and has a high electron mobility can be readily fabricated at low cost.

Where a semiconductor thin film obtained as described above is used, a characteristic deterioration which would have been heretofore caused by cracks in the film is prevented. A Hall-effect device having sufficiently high reliability and exhibiting excellent characteristics within the temperature range from −50° C. to +150° C. is provided.

Other objects and features of the invention will appear in the course of the description thereof, which follows.

DETAILED DESCRIPTION OF THE PREFERRED EMBODIMENTS

EXAMPLE 1

Figure 1A:
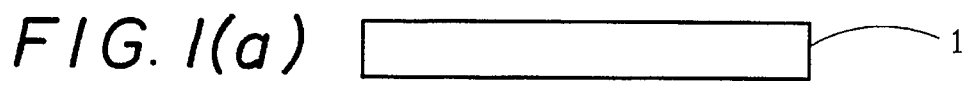
FIG. 1, (a)–(d), are cross-sectional views of a semiconductor thin film, illustrating the successive steps of forming the thin film, which forms Example 1 of the invention.
Figure 1B:
Figure 1C:
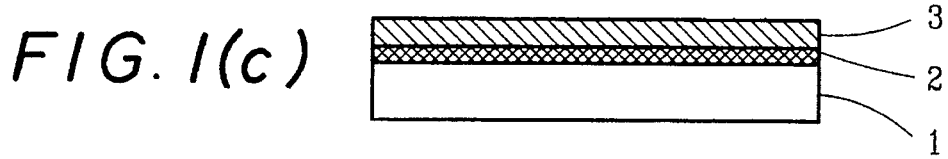
Figure 1D:
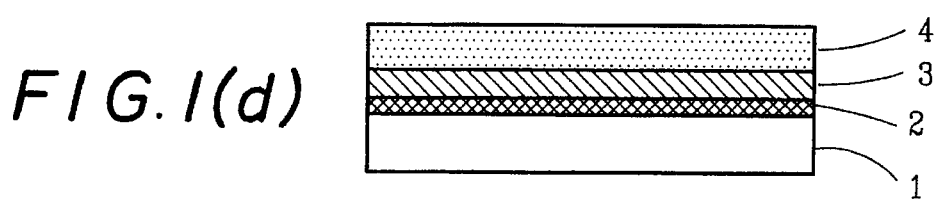
Figure 2:
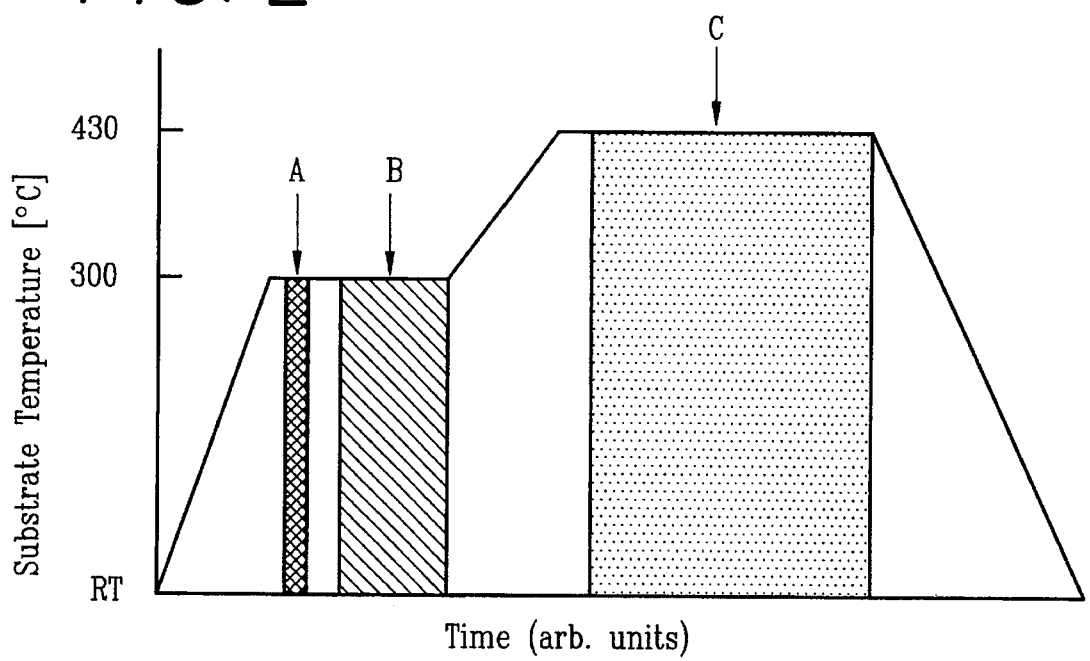
FIG. 2 is a graph illustrating changes in the substrate temperature in the manufacturing process of Example 1.

The manufacturing steps of the present example are successively described by referring to FIGS. 1 and 2. Referring to FIG. 1(a), a substrate 1 having a diameter of 3 inches is obtained by cutting the (111) surface of a single crystal of Si having a resistivity exceeding 1000 Ω-cm. The substrate 1 of a single crystal of Si was cleaned with an organic solvent, with an acid, and then with an alkali solvent to remove contaminants such as organic materials and metals from the surface. Thereafter, the substrate was immersed in a 5% HF solution for 1 minute to remove the oxide film on the surface, and to terminate the dangling bonds of the Si atoms at the surface with hydrogen atoms. Subsequently, the substrate was rinsed within deionized water for 5 minutes to continue the hydrogen termination.

Immediately after the hydrogen termination processing described above, the substrate 1 was placed into vacuum evaporation equipment. The pressure inside the equipment was maintained below $5 \times 10^{-4}$ Pa. Under this condition, the substrate temperature was set to 300° C. When the substrate temperature stabilized as indicated by A in FIG. 2, In was evaporated by resistance heating to form an initial layer 2 out of In as shown in FIG. 1(b). The evaporation rate was 0.05 nm/s. The thickness was 0.2 nm. The pressure was below $1 \times 10^{-3}$ Pa. This degree of vacuum was maintained also in the following steps.

Then, a buffer layer 3 was formed out of InSb on the initial layer 2 by coevaporation of In and Sb as shown in FIG. 1(c). At this time, the substrate temperature was maintained at 300° C. as indicated by B in FIG. 2. The rate at which In was evaporated was 0.1 nm/s. The ratio of the number of the evaporated Sb particles to the number of evaporated In particles (hereinafter often referred to as the Sb/In) was kept at 1.5. Both In and Sb were evaporated for 200 seconds. Then, the substrate temperature was elevated to 430° C. as indicated by B-C in FIG. 2, and this temperature was maintained. Thereafter, a semiconductor thin film 4 shown in FIG. 1(d) was formed as indicated by C in FIG. 2. At this time, the evaporation rate of In was 0.75 nm/s. The Sb/In was maintained at 2. The In and Sb were evaporated for 2000 seconds.

Figure 3A:
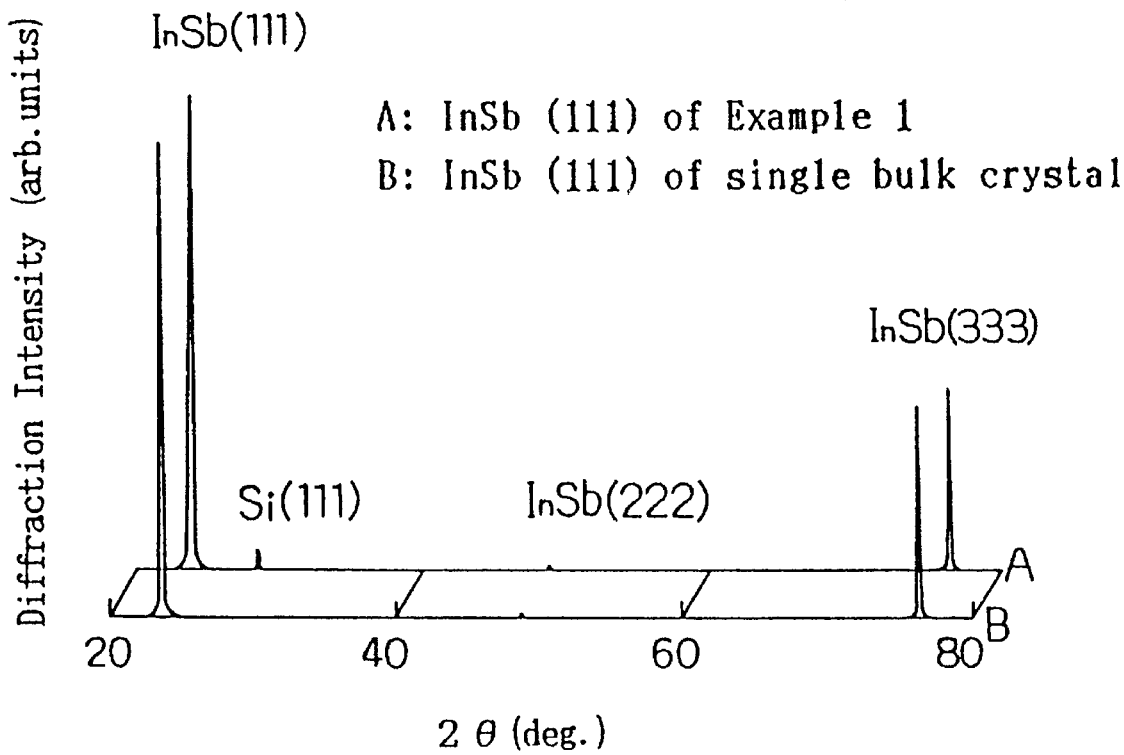
FIG. 3(a) is a diagram illustrating an X-ray diffraction pattern obtained from a semiconductor thin film formed on (111) Si wafer by Example 1.

During the formation of the semiconductor thin film by the steps described thus far, in-situ observations of the film were made inside the vacuum evaporation equipment by reflection high-energy electron diffraction (RHEED). We have confirmed that InSb in the buffer layer 3 and in the semiconductor thin film 4 was epitaxially grown on (111) surface of the Si substrate 1. The film thickness of the semiconductor thin film 4 obtained in this way was 4 μm. The crystallinity of the thin film 4 was evaluated by x-ray diffraction(XRD). The results are shown in FIG. 3(a). For comparison, InSb (111) surface of a commercially available single bulk crystal is also shown in FIG. 3(a). As can be seen from this graph, the semiconductor thin film 4 showed a diffraction pattern similar to that of the bulk crystal. The electron mobility of this thin film 4 was measured by the Van der Pauw's method, and the mobility assumed high values of 3.7 to 4.2 $m^2$/V-s at room temperature. The adhesiveness between any adjacent layers of the substrate 1 of single crystal of Si, the initial layer 2, the buffer layer 3, and the semiconductor thin film 4 was good. A thermal shock test from −50° C. to +150° C. was repeated but any problem such as peeling or characteristic deterioration did not take place.

Figure 4A:
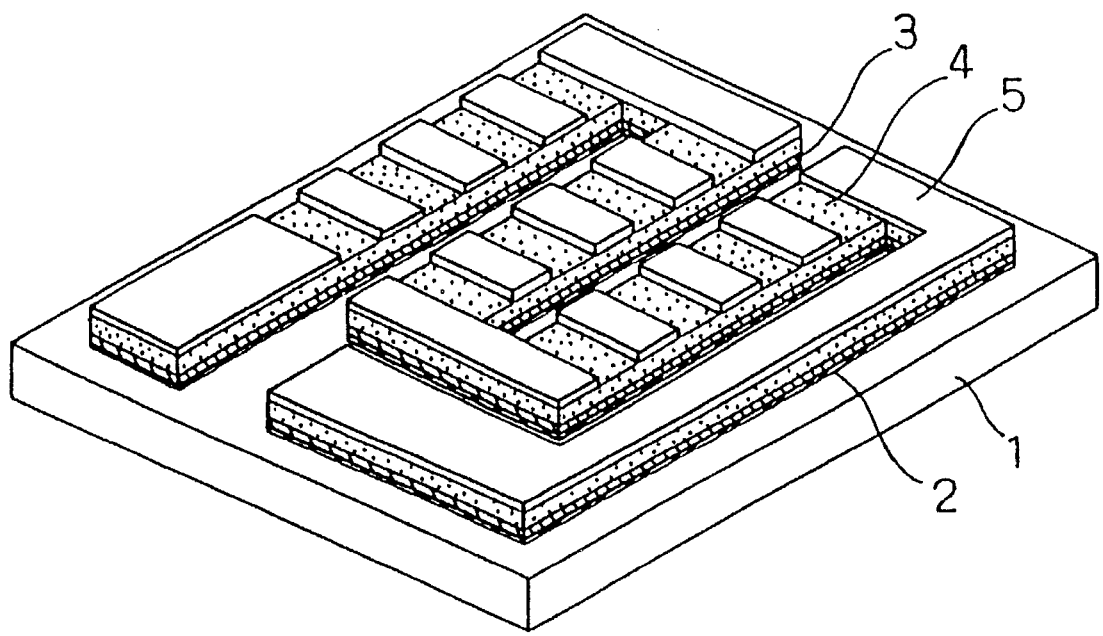
FIG. 4(a) is a schematic perspective view of a magnetoresistor fabricated in Example 1.
Figure 4B:
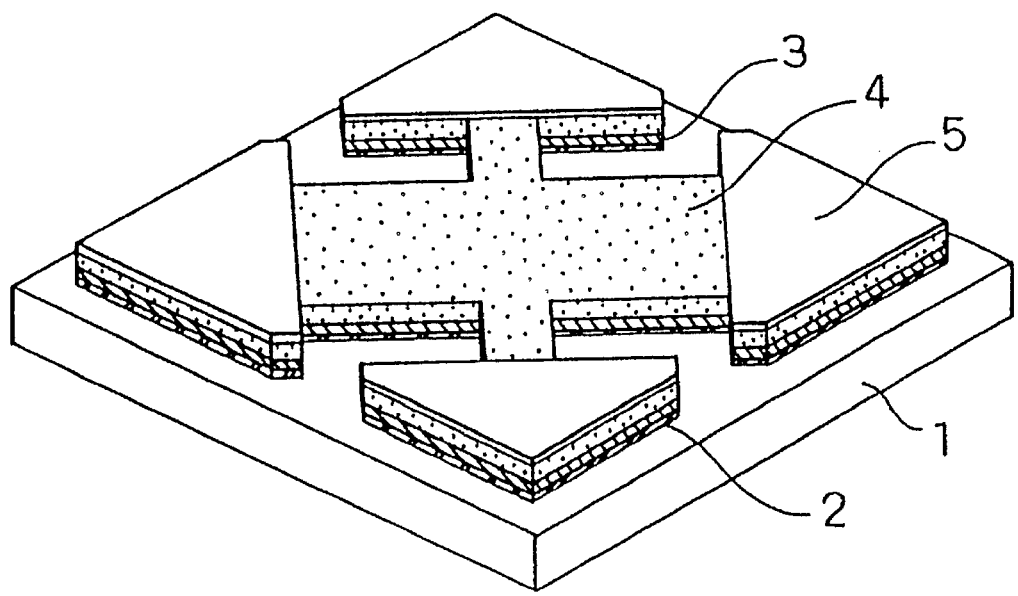
FIG. 4(b) is a schematic perspective view of a Hall generator fabricated in Example 1.

Two Hall-effect devices shown in FIG. 4, (a) and (b), respectively, have been obtained by photolithographically patterning the semiconductor thin film 3 fabricated as described above and attaching electrodes 5. Shown in FIG. (a) is a magneto-resistor. Shown in FIG. 4(b) is a Hall generator. The electrodes 5 have been obtained by depositing titanium and copper in succession by electron beam evaporation and then photolithographically patterning these layers. Although a thermal shock test between −50° C. and +150° C. was repeated for the Hall-effect device, any device deterioration such as peeling, cracks, or characteristic deteriorations was not observed. We have confirmed that the Hall-effect device has quite high reliability.

In this way, in the present example, a semiconductor thin film having a high electron mobility and a Hall-effect device having excellent characteristics and high reliability can be fabricated.

It is to be noted that during fabrication of the above-described semiconductor thin film, the various manufacturing conditions are not limited to the foregoing. The reason will be described below in greater detail about successive manufacturing steps, based on the results of experiments.

First, surface treatment of the substrate is described. The Si on the surface of the substrate 1 after cleaning is oxidized. This oxide film is amorphous and so the atoms on the surface are arranged irregularly. However, it is known that the oxide film is removed by immersing the substrate in the HF solution and that dangling bonds of Si atoms on the surface are terminated with hydrogen atoms (Hirose, Oyo Buturi, 61, No. 11, (1992), p. 1124). If this is rinsed within deionized water, an atomically flat surface is obtained. That is, a monolayer of hydrogen atoms is formed on the surface, and each hydrogen atom is bonded vertically to an inner atom. Furthermore, these hydrogen atoms exist stably on the (111) surface, thus preventing surface oxidation. In this way, a stable surface consisting of a regular array of hydrogen atoms similarly to a single crystal of Si is obtained. Hydrogen termination methods using solutions other than HF solution are also known. For example, $NH_4F$ solution can also be employed. Hydrogen plasma inside vacuum evaporation equipment can be utilized (A. Kishimoto, Jap. J. Appl. Phys. Vol. 29, No. 10 (1990), pp. 2273). Hydrogen ion-beam irradiation can be used. Moreover, heating inside a hydrogen ambient can be exploited. On surfaces other than (111) surface, the stability is poor and oxidation progresses within atmosphere. Therefore, hydrogen termination is preferably effected within vacuum evaporation equipment.

Figure 5:
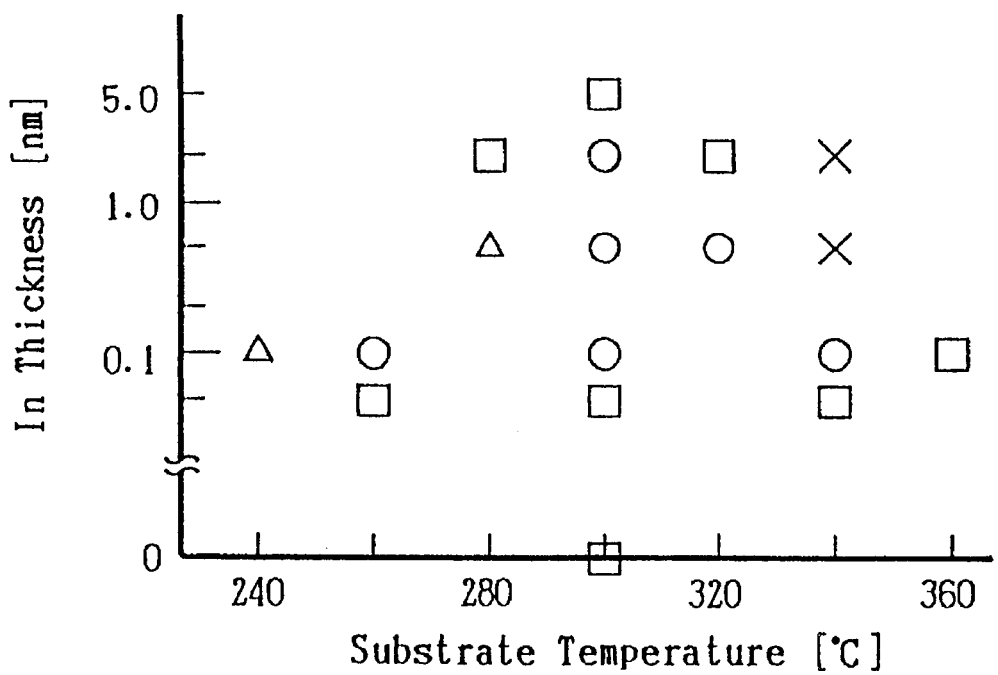
FIG. 5 is a graph illustrating the relations among the thickness of an initial layer of Example 1, the temperature at which a buffer layer is started to be grown, and the film structures of obtained buffer layers.

The conditions under which various films are formed are described together with the mechanism by which the films are grown. The crystallinity of the semiconductor thin film 4 depends heavily on the crystallinity of the buffer layer 3. The crystallinity of the buffer layer 3 is affected greatly by the thickness of the initial layer 2 of In and also by the temperature at which the buffer layer 3 is started to be grown. FIG. 5 shows these relations, based on the crystallinity at the initial stage of formation of the buffer layer 3 where the Sb/In is 1.5. In FIG. 5, samples indicated by "○" have been proved to have been epitaxially grown. Semiconductor thin films 4 which were started to be grown within the range indicated by "○" and formed by the method described previously had electron mobilities of 3.7 to 4.2 $m^2$/V s. On the other hand, each sample indicated by "□" consists of an epitaxially grown film mingled with polycrystals. Samples indicated by "Δ" are aligned to the <111>-oriented film (the orientations vertical to the surface are aligned to <111> but orientations parallel to the surface are not uniform). Samples indicated by "X" are polycrystalline films in the form of clusters. These samples showed electron mobilities less than 3 $m^2$/V s. In this manner, where the thickness of In layer is less than the thickness of a monoatomic layer on (111) surface of InSb, or 0.1 nm, or where such an In layer is not formed, polycrystals are mingled with an epitaxial layer, thus making it impossible to form the buffer layer 3 of high quality. Also, where the In layer thickness is in excess of 2 nm, a similar situation occurs. A similar result is obtained where the Sb/In is varied. In addition, where the thickness lies within the range from 0.1 to 2 nm, if the substrate temperature is low, only a (111)-oriented film obtained. If the substrate temperature is high, In particles coagulate, the buffer layer 3 forms lumps. In consequence, a high-quality film cannot be obtained. This temperature range can be extended by increasing the Sb/In at larger values of the In thickness. However, the range could not be made wider than the range obtained where the thickness was 0.1 nm. This requires that the thickness of the initial layer 2 of In be 0.1 to 2 nm and that the temperature at which the buffer layer 3 is started to be grown be 250° to 350° C.

Figure 6:
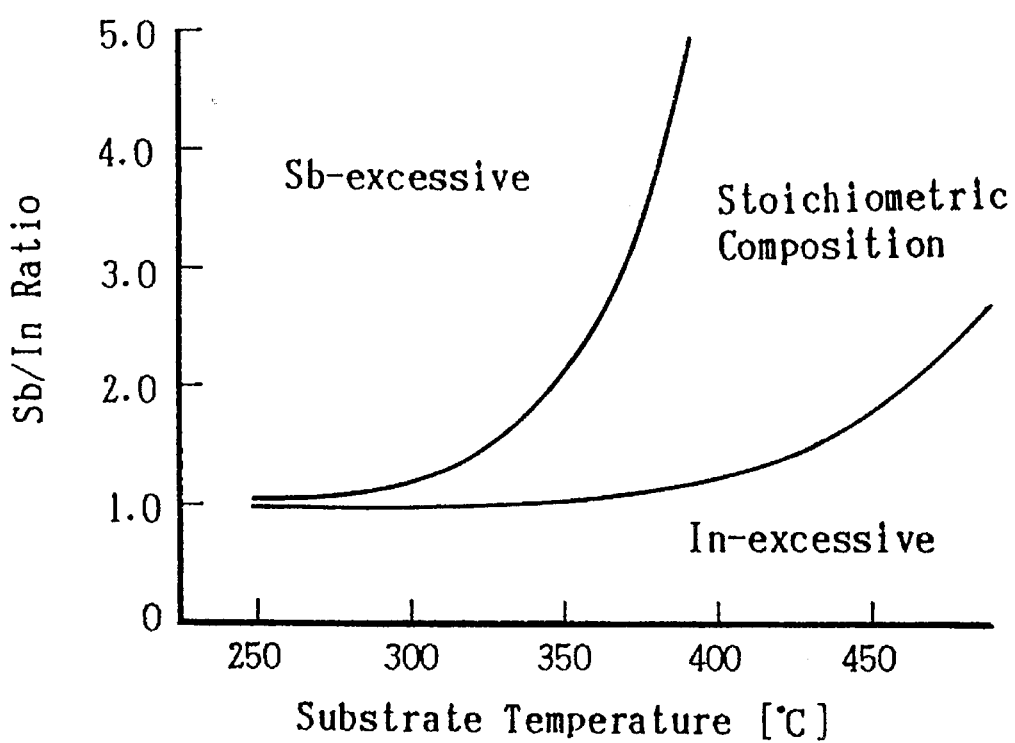
FIG. 6 is a graph illustrating the relation among the ratio of the number of evaporated Sb particles to the number of evaporated In particles, the substrate temperature, and the compositions of obtained semiconductor thin films.

Although the InSb layer formed within the temperature range described above is an epitaxially grown layer, the range of Sb/In providing the stoichiometric ratios is quite narrow as shown in FIG. 6. It is difficult to control this range stably. However, an Sb-excessive film can have a stoichiometric ratio by temperature elevation because excessive Sb atoms can be released by temperature elevation, since Sb has a high vapor pressure. At this time, it is necessary that the substrate temperature be higher than the temperature at which the vapor pressure of Sb is equal to the pressure inside the evaporation equipment. Specifically, in the present example, the temperature is set above 370° C. to produce a pressure of $1 \times 10^{-3}$ Pa. However, if the portions containing excessive Sb are thick, then it is impossible to drive off Sb. Hence, making the film thickness too large is not desired. Since excessive Sb atoms are released, the thickness of the formed InSb film is determined by the accumulative thickness of In, i.e., evaporation rate of In × evaporation time. Experiments have shown that the thickness of the InSb film is about 8/3 times as large as the accumulative thickness of In. We have confirmed that in the Sb-excessive region, the result is not affected by the Sb/In. Where this accumulative thickness of In is used, the accumulative thickness of In of the buffer layer 3 from which excessive Sb atoms can be released is preferably not greater than about 50 nm. Where the accumulative In layer is thin, coagulation takes place at elevated temperatures and so the accumulative thickness should be greater than 1.5 nm. If the Sb/In is too large, then the buffer layer 3 becomes coarse at high temperatures and the crystallinity deteriorates. Therefore, this ratio is preferably less than 6.

Figure 7:
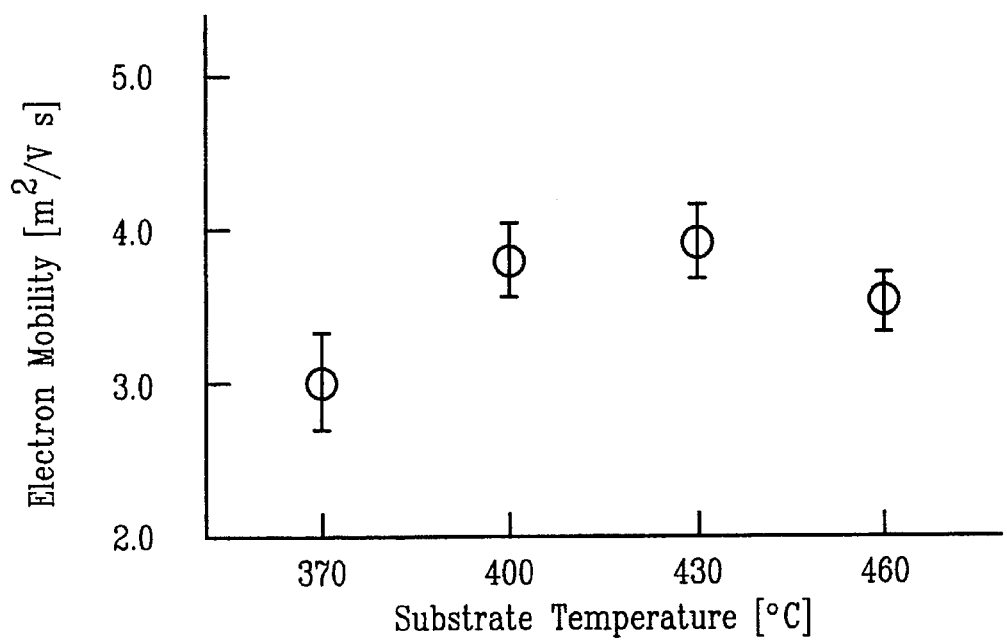
FIG. 7 is a graph illustrating the relation of the substrate temperature when a semiconductor thin film is formed in Example 1 to the electron mobility of the thin film.

During formation of the semiconductor thin film 4, the Sb/In was maintained at 2. The relation of the electron mobility of the film to the substrate temperature under this condition is shown in FIG. 7. As can be seen from this graph, good electron mobilities greater than 3 $m^2/V$ s were obtained above 370° C. Below 370° C., the composition contains excessive Sb atoms and, therefore, good films cannot be formed. Preferably, the substrate temperature is set above 400° C., because high electron mobilities exceeding about 3.5 $m^2/V$ s were derived, for the following reason. As the temperature is elevated, the growth rate of crystal grains in the direction of the surface is increased, and a good film consisting of bonded crystal grains is formed. Furthermore, the Sb/In can be varied within a wide range and so an InSb film of a stoichiometric ratio can be obtained. Where the semiconductor thin film 4 is formed above 460° C., Sb atoms are released violently from the InSb, thus deteriorating the crystallinity and the surface characteristics. This makes it impossible to have an InSb film of good quality. Therefore, it is important that the semiconductor thin film 4 be formed within the temperature range from 370° to 460° C. Preferably, the temperature range is between 400° and 460° C.

No evaporation rate difference cannot be observed within controllable ranges (i.e., the evaporation rate of In is between 0.01 and 1 nm/s, and the evaporation rate of InSb is 8/3 times as high as the evaporation rate of In) of the present example. The evaporation rates can be set at will within controllable ranges of thicknesses, taking the evaporation times into account. In this way, the semiconductor thin film 4 having a high electron mobility can be obtained under various manufacturing conditions as described above. In the present example, the initial layer 2 and the buffer layer 3 are formed separately. These layers may be formed successively.

Figure 3B:
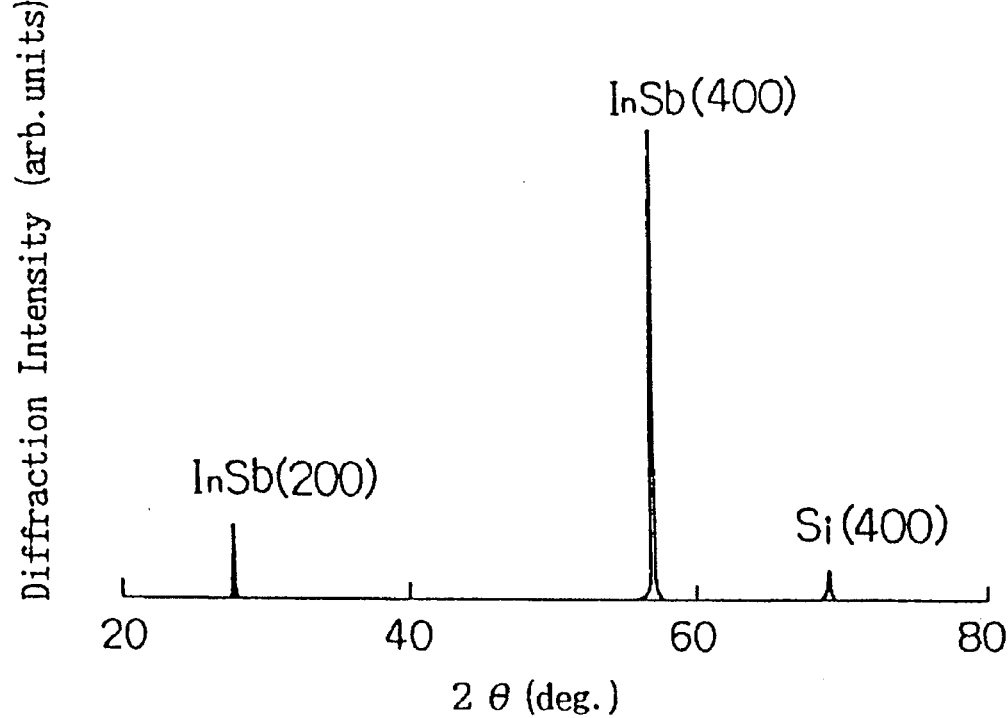
FIG. 3(b) is a diagram illustrating an X-ray diffraction pattern obtained from a semiconductor thin film formed on (100) Si wafer by Example 1.

Also in the above example, (111) surface of the single crystal of Si is used as the substrate 1. Where (100) surface is used, a semiconductor thin film that is epitaxially grown in (100) direction is obtained as shown in FIG. 3(b). In the (100) orientation, the electron mobility was comparable to that obtained in the (111) orientation. In this way, a semiconductor thin film showing good characteristics irrespective of the grown surface can be obtained.

EXAMPLE 2

The manufacturing steps of the present example are similar to the steps of Example 1 except for the conditions under which the buffer layer 3 is formed. In Example 1, the substrate temperature is maintained constant during formation of the buffer layer 3. In the present example, the buffer layer 3 is formed while elevating the temperature.

Figure 8:
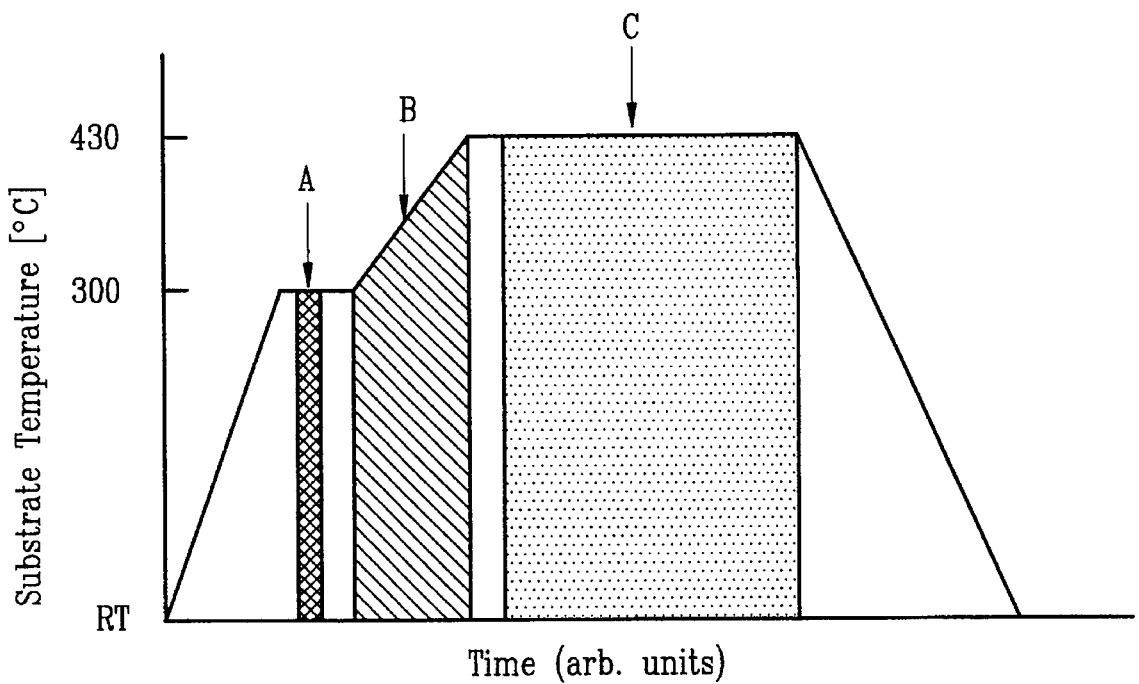
FIG. 8 is a graph illustrating changes in the substrate temperature in the manufacturing process of Example 2 of the invention.

The temperature profile in the present example is shown in FIG. 8. The process of Example 1 was carried out until the initial layer 2 was formed. Then, the buffer layer 3 was started to be grown at 300° C. as indicated by B in FIG. 8. Immediately thereafter, the substrate temperature was started to be elevated. The rate at which the temperature was elevated was maintained constant such that the temperature reached 430° C. when the formation of the buffer layer 3 ended during this step, the Sb/In was increased from 1.5 to 2. At this time, the other conditions were the same as used in Example 1. Thereafter, the semiconductor thin film 4 was formed in the same way as in Example 1.

The crystallinity of the semiconductor thin film 4 was evaluated by RHEED and XRD. It was confirmed that the film was grown epitaxially in the same way as in Example 1. The electron mobilities at room temperature were 3.5 to 4.0 $m^2/V$-s, which were close to the values obtained in Example 1. Furthermore, the adhesiveness between the successive layers was good. A thermal shock test has shown that the fabricated Hall-effect devices did not deteriorate. Hence, the devices have quite high reliability.

The conditions under which the buffer layer 3 was formed is not limited to the foregoing. This is further described with reference to the process of formation of the buffer layer 3. The range of temperatures at which the buffer layer 3 is started to be grown is the same as the temperature range adopted in Example 1. The layer contains excessive Sb atoms. In the present example, the temperature was elevated to 370° C. or above at which Sb atoms are released, while growing the buffer layer 3. In this method, Sb atoms can be released by temperature elevation and a stoichiometric ratio can be obtained for the same reason as in Example 1. Since the growth is continued while elevating the temperature, if the portion containing excessive Sb is thick, then Sb will not be released. Therefore, the temperature is preferably elevated to 370° C. or above before the accumulative thickness of In reaches about 15 nm. At and above 370° C., the Sb/In, the formed film thickness, and the temperature elevation rate can be set at will within the range in which the stoichiometric composition shown in FIG. 6 can be obtained.

Figure 9:
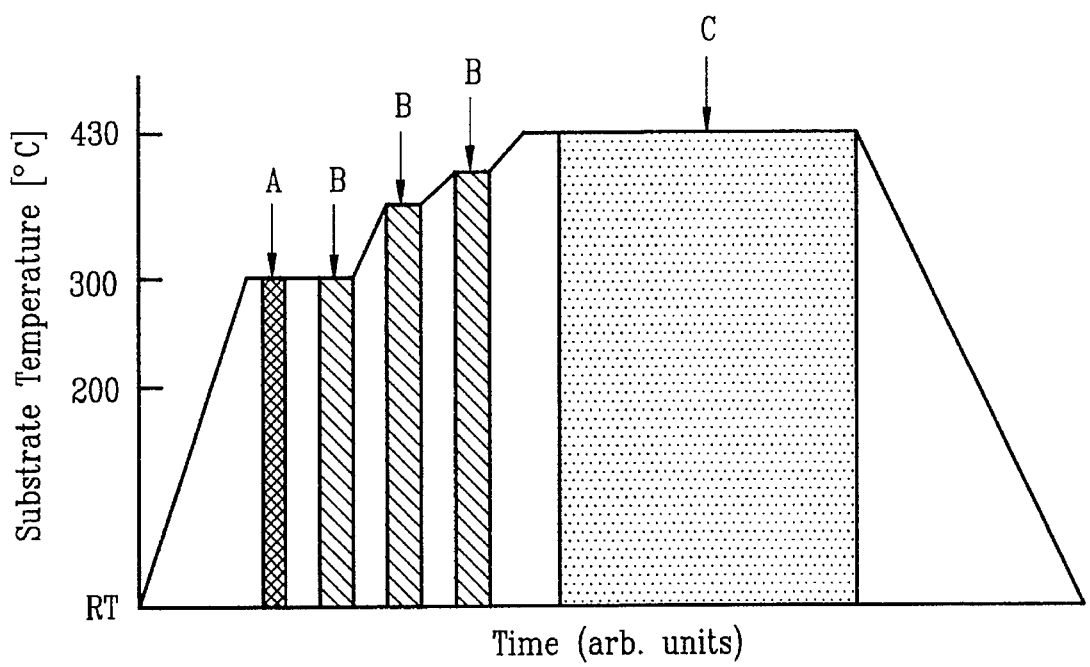
FIG. 9 is a graph illustrating changes in the substrate temperature in a modification of the manufacturing process of Example 2.

As described above, semiconductor thin films 4 having high electron mobilities can be fabricated under various conditions. In the present example, the substrate temperature is increased continuously during formation of the buffer layer 3. Similar advantages can be derived by elevating the temperature in a stepwise fashion as shown in FIG. 9. In the present example, the initial layer 2, the buffer layer 3, and the semiconductor thin film 4 are formed separately. These layers may be formed successively.

EXAMPLE 3

The manufacturing steps of the present example are similar to the steps of Example 1 except for the conditions under which the buffer layer 3 is formed. In Example 1, the substrate temperature is maintained constant during formation of the buffer layer 3. In the present example, the buffer layer 3 is formed while lowering the temperature.

Figure 10:
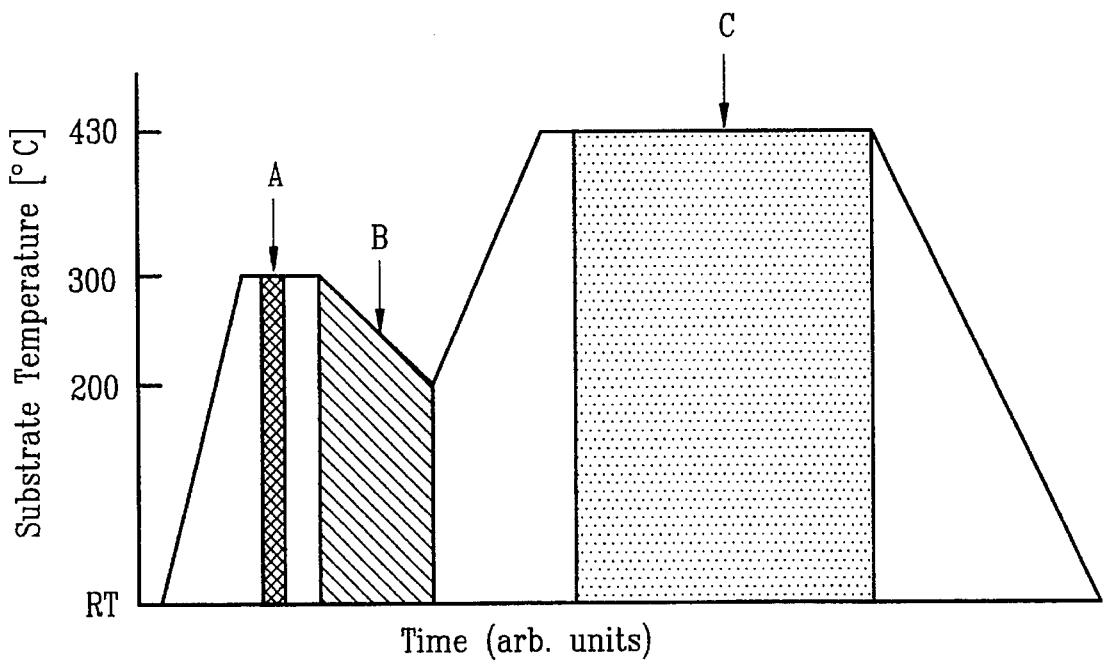
FIG. 10 is a graph illustrating changes in the substrate temperature in the manufacturing process of Example 3 of the invention.

The temperature profile in the present example is shown in FIG. 10. The process of Example 1 was carried out until the initial layer 2 was formed. Then, the buffer layer 3 was started to be grown at 300° C. as indicated by B in FIG. 10. Immediately thereafter, the substrate temperature was started to be lowered. The rate at which the temperature was lowered was maintained constant such that the temperature reached 200° C. when the formation of the buffer layer 3 ended during this step, the Sb/In was maintained at 2. At this time, the other conditions were the same as used in Example 1. Then, the substrate temperature was elevated to 430° C. at a rate of 2° C./s. Thereafter, the semiconductor thin film 4 was formed in the same way as in Example 1.

It was confirmed that the semiconductor thin film 4 was grown epitaxially in the same way as in Example 1. The electron mobilities at room temperature were 4.6 to 5.0 $m^2/V$ s, which were higher than the values obtained in Example 1. Furthermore, the adhesiveness between the successive layers was good similarly to Example 1. The fabricated Hall-effect devices had quite high reliability in the same way as in Example 1.

It is to be understood that the conditions under which the buffer layer 3 is fabricated are not limited to the foregoing. The reason will be described below in greater detail in connection with the process of formation of the buffer layer 3.

The buffer layer 3 was epitaxially grown with excessive Sb in the initial stage of the growth in the same way as in Example 1. However, observation by RHEED has revealed that as the substrate temperature dropped., the film changed from an epitaxial film to an amorphous film continuously. The temperature at which the film is amorphized is elevated with increasing the Sb/In. Where the Sb/In is equal to or greater than 1.5, the film can be made amorphous with certainty by lowering the temperature below 230° C. The film thickness was the same as the film thickness of Example 1. Under this condition, the temperature was elevated to the temperature (370°–460° C.) at which the next semiconductor thin film 4 is formed. As a result, excessive Sb atoms were released, and the upper layer was grown by solid phase epitaxy in which the lower epitaxial layer acted as a nucleus. The buffer layer 3 became smoother than the buffer layer 3 formed in Example 1. At this time, as the temperature elevation rate is increased, the smoothness of the buffer 3 is enhanced and an InSb film of higher quality is obtained. However, because of limitations imposed on the heating mechanism of the equipment, we could not discuss temperature elevation rates exceeding 3° C./s. On the other hand, where the temperature elevation rate was less than 0.5° C./s, solid phases grew at random inside the upper amorphous layer independent of the solid phase epitaxial growth from the lower layer. The result is that polycrystals intermingled. Therefore, it is necessary that the temperature be elevated at a rate exceeding 0.5° C./s until it reaches at least 370° C.

The semiconductor thin film 4 was formed on the buffer layer 3 obtained in this way, in the same way as in Example 1.

Figure 11:
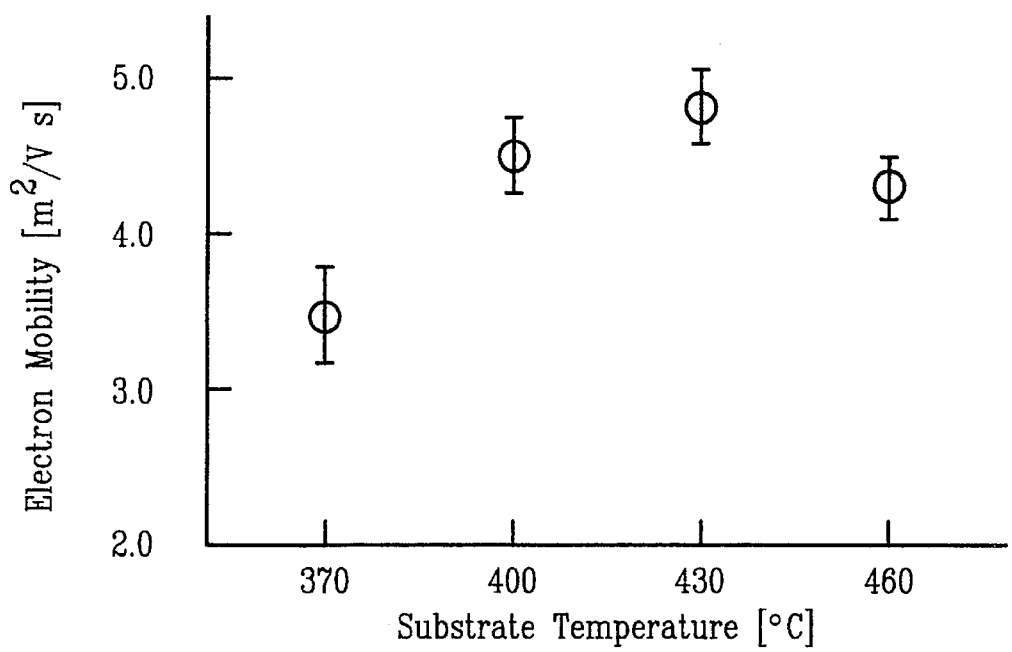
FIG. 11 is a graph illustrating the relation of the substrate temperature when a semiconductor thin film is formed in Example 3 to the electron mobility of the thin film.

The relation of the electron mobility to the substrate temperature, or the temperature at which the thin film 4 is grown, is shown in FIG. 11. Semiconductor thin films 4 exhibiting high electron mobilities exceeding 3.5 $m^2/V$ s over the wide range from 370° to 460° C. were derived. Especially, above 400° C., excellent electron mobilities exceeding 4.0 $m^2/V$ s were obtained. These films had smooth surfaces. In this way, semiconductor thin films 4 exhibiting high electron mobilities under various conditions as described above can be obtained.

Figure 12:
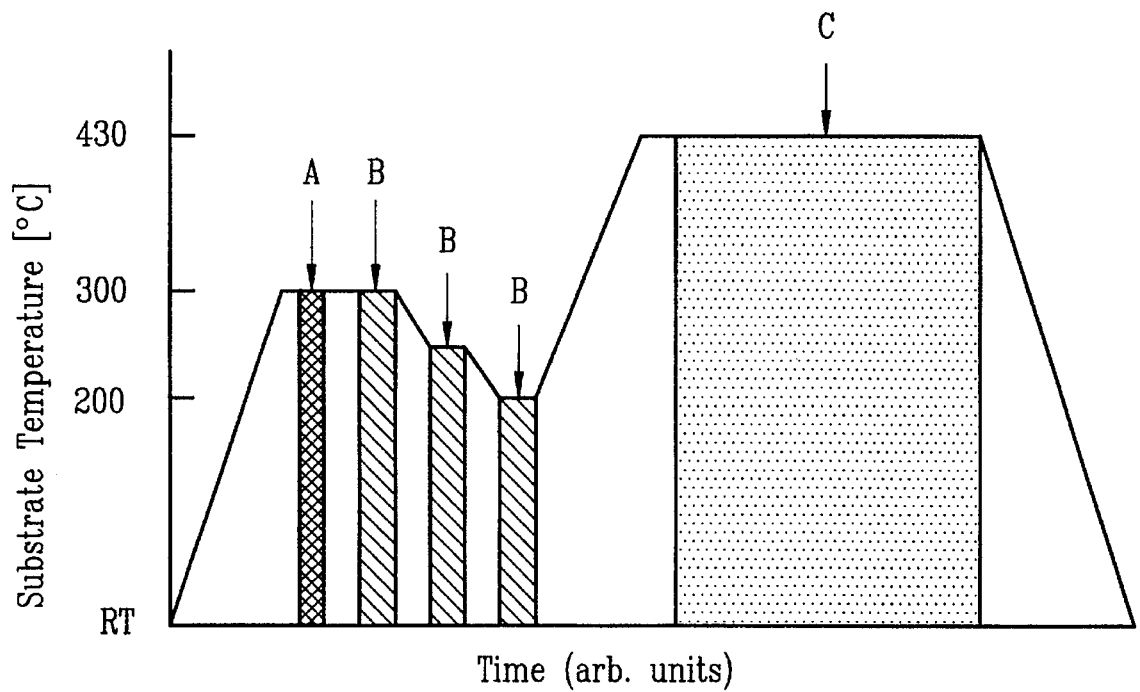
FIG. 12 is a graph illustrating changes in the substrate temperature in a modification of the manufacturing process of Example 3.

In the present example, the temperature at which the buffer layer was grown was lowered continuously. As shown in FIG. 12, the temperature may be lowered in a stepwise fashion. Also, in this case, the surface layer of the buffer layer is amorphized. As the temperature is elevated, the amorphous layer is grown by solid phase epitaxy and becomes high-quality buffer layer 3. In the present example, the initial layer 2 and the buffer layer 3 are formed separately. These layers may be formed successively.

EXAMPLE 4

The manufacturing steps of the present example are similar to the steps of Example 1 except for the conditions under which the buffer layer 3 is formed. In Example 1, the Sb/In is maintained constant during formation of the buffer layer 3. In the present example, the buffer layer 3 is formed while increasing this ratio.

Figure 13:
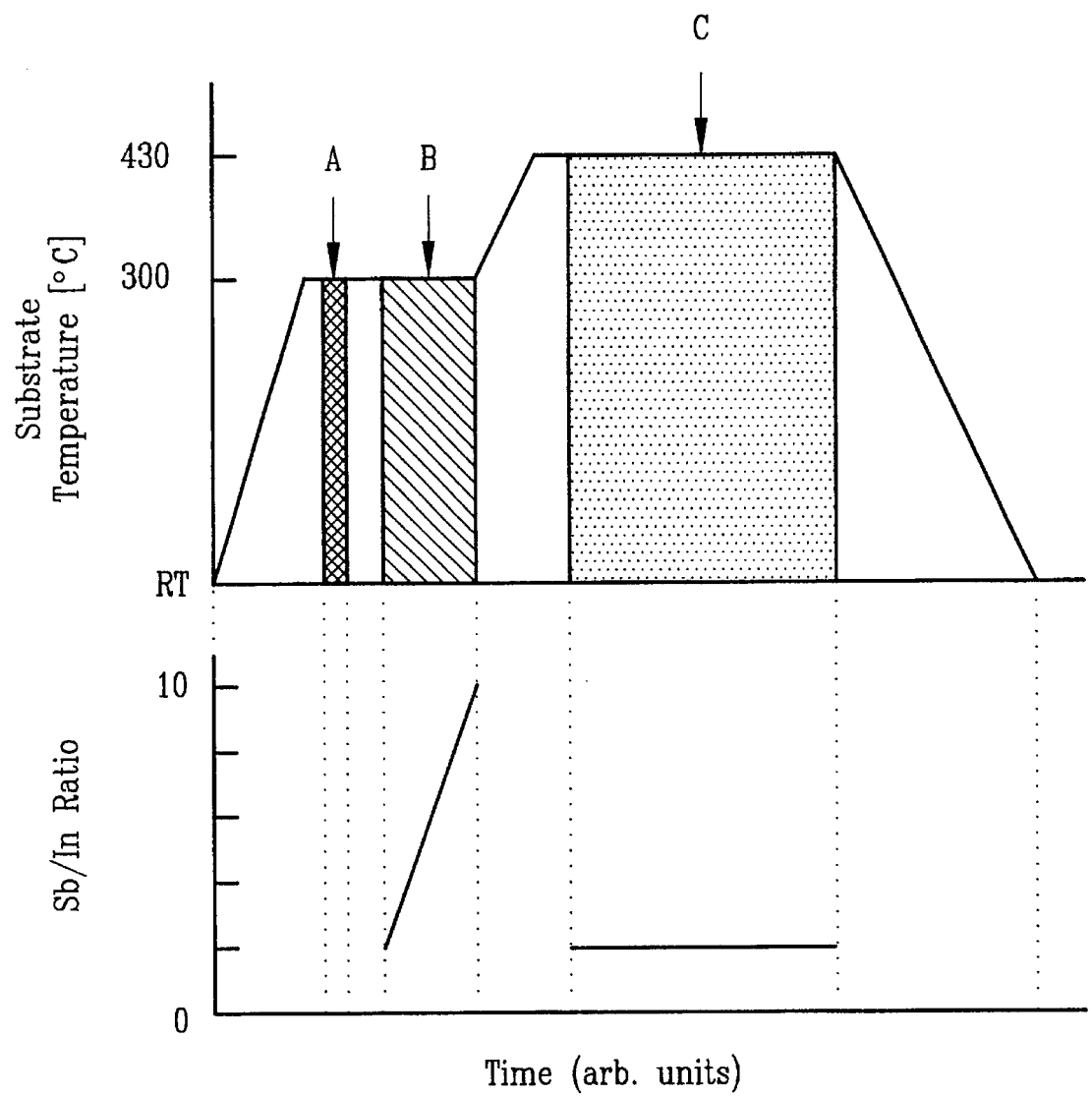
FIG. 13 is a graph illustrating changes in the substrate temperature in the manufacturing process of Example 4.

The temperature profile and the Sb/In profile in the present example are shown in FIG. 13. The initial layer 2 was formed under the same conditions as in Example 1. Then, the buffer layer 3 was grown at 300° C. as indicated by B in FIG. 13 while increasing the Sb/In at a constant rate with increasing the thickness. The initial value of the Sb/In was 2. The value of the Sb/In at the end of the growth was 10. At this time, the other conditions were the same as used in Example 1. Then, the substrate temperature was elevated to 430° C. at a rate of 2° C./s in the same way as in Example 3. Thereafter, the semiconductor thin film 4 was formed in the same way as in Example 1.

It was confirmed that the semiconductor thin film 4 was grown epitaxially in the same way as in Example 1. The electron mobilities at room temperature were 4.2 to 4.7 $m^2/V$ s, which were close to the values obtained in Example 3. Furthermore, the adhesiveness between the successive layers was good similarly to Example 1. The fabricated Hall-effect devices had quite high reliability in the same manner as in Example 1.

It is to be understood that the conditions under which the buffer layer 3 is fabricated are not limited to the foregoing. The reason will be described below in greater detail in connection with the process of formation of the buffer layer 3.

The buffer layer 3 was epitaxially grown in the initial stage of the growth in the same way as in Example 1. However, observation by RHEED has revealed that as the Sb/In increased, the film became Sb-excessive and film changed from an epitaxial film to an amorphous film. That is, in this method, a buffer layer 3 similar to the buffer layer 3 of Example 3 can be formed. Then, the temperature was elevated in the same way as in Example 3, whereby the quality of the buffer layer 3 could be improved. The initial value of the Sb/In is preferably less than 6 as described in Example 1. In order to amorphize the film within this temperature range, it is necessary to set the Sb/In larger than 8. More preferably, the Sb/In is set larger than 10. In this way, semiconductor thin films 4 having high electron mobilities can be obtained under various conditions. In the present example, during growth of the buffer layer, the Sb/In was increased continuously. The Sb/In may be increased in a stepwise fashion. Also in the present example, the initial layer 2 and the buffer layer 3 are formed separately. These layers may be formed successively.

EXAMPLE 5

The manufacturing steps of the present example are similar to the steps of Example 2 except for the method of forming the initial layer 2 and for the conditions under which the buffer layer 3 is formed. The temperature profile of the present example is similar to the temperature profile of FIG. 8 but different temperatures are used.

The hydrogen termination of the substrate and introduction into vacuum equipment in Example 2 were effected. Under this condition, the substrate temperature was set to 380° C. Then, the initial layer 2 of Al was formed to a thickness of 0.2 nm by electron beam evaporation. At this time, the evaporation rate was 0.05 nm/s. At this temperature, the buffer layer 3 was started to be grown by coevaporation of In and Sb, utilizing resistance heating. Immediately thereafter, the substrate temperature was started to be elevated. The temperature was elevated at a constant rate such that the substrate temperature reached 430° C. at the end of the growth of the buffer layer 3 . The Sb/In was maintained constant. At this time, the other conditions were the same as used in Example 2. Thereafter, the semiconductor film 4 was formed in the same way as in Example 2.

It was confirmed that the semiconductor thin film 4 was grown epitaxially in the same way as in Example 1. The electron mobilities at room temperature were 4.1 to 4.8 $m^2/V$ s, which were excellent values close to the values obtained in Example 3. Furthermore, the adhesiveness between the successive layers was good similarly to Example 1. The fabricated Hall-effect devices had quite high reliability in the same manner as in Example 1.

It is to be understood that the conditions under which the initial layer 2 and buffer layer 3 are formed are not limited to the foregoing. The reason will be described below in greater detail in connection with the process of formation.

Where the initial layer 2 is made of Al, the crystallinity of the layer is affected greatly by the thickness of the initial layer 2 and also by the temperature at which the buffer layer 3 is started to be grown, in the same way as in Example 1 where the initial layer 2 is made of In. Experiments were effected on Al similarly to the experiments on In shown in FIG. 5. The thickness of the initial layer 2 on which the buffer layer 3 was epitaxially grown was 0.1 to 3 nm. The temperature at which the layer was started to be grown was in the range from 250° to 430° C.

As described above, semiconductor thin films 4 having high electron mobilities can be fabricated under various conditions. Where the temperature at which the buffer layer was started to be epitaxially grown is comparatively high within the above-described range, the surface of the buffer layer 3 is roughened. Therefore, the starting temperature is preferably below 400° C. Where the semiconductor thin film 4 is formed above 400° C., good film quality is obtained. Therefore, it is desired to elevate the temperature after the buffer layer 3 is started to be formed at a low temperature.

In the present example, the buffer layer 3 was formed while elevating the temperature in the same way as in Example 2. However, this example is not restricted to this method. For example, if the temperature at which the buffer layer 3 is started to be grown lies within the range from 250° to 370° C., then the buffer layer 3 becomes Sb-excessive. Consequently, any of the methods of Examples 1–4 can be applied. If the temperature is between 370° to 400° C., then a stoichiometric composition can be easily obtained from the beginning of the growth of the layer. This fabricates the manufacturing steps of Examples 1 and 2, producing desirable results.

EXAMPLE 6

The manufacturing steps of the present example are similar to the steps of Example 5 except for the manner in which the initial layer 2 is formed. In Example 5, the initial layer 2 is made of Al. In the present example, the initial layer 2 is made of Ga.

The temperature of a substrate was set to 380° C. after the substrate was introduced into vacuum equipment, in the same way as in Example 5. Then, an initial layer 2 made of Ga was formed to a thickness of 0.2 nm by electron beam evaporation. At this time, the evaporation rate was 0.05 nm/s. Subsequently, a buffer layer 3 and a semiconductor thin film 4 were formed in the same way as in Example 5.

It was confirmed that the semiconductor thin film 4 was grown epitaxially in the same way as in Example 1. The electron mobilities at room temperature were 4.1 to 4.7 $m^2/V$ s, which were close to the values obtained in Example 5. Furthermore, the adhesiveness between the successive layers was good similarly to Example 1. The fabricated Hall-effect devices had quite high reliability in the same manner as in Example 1.

It is to be understood that the conditions under which the initial layer 2 is formed are not limited to the foregoing. The reason will be described below in greater detail in connection with the process of formation.

Experiments were effected on Ga similarly to the experiments on In shown in FIG. 5, in the same way as in Example 5. The thickness of the initial layer 2 on which the buffer layer 3 was epitaxially grown was 0.1 to 2 nm, in the same way as in the case of In. However, the temperature range differed, and an epitaxial film was obtained in the range from 250° to 400° C.

As described above, semiconductor thin films 4 having high electron mobilities could be fabricated under various conditions described above. If the temperature at which the buffer layer is started to be epitaxially grown is above 380° C. within this range, the surface of the buffer layer 3 is roughened in the same way as in Example 5. Therefore, it is desired to elevate the temperature after the buffer layer 3 is started to be formed at a low. temperature. In the present example, the buffer layer 3 is grown while elevating the temperature in the same way as in Example 2 but the present example is not limited to this method similarly to Example 5.

EXAMPLE 7

The manufacturing steps of the present example are similar to the steps of Example 5 except for the manner in which the initial layer 2 is formed. In Example 5, the initial layer 2 is made of Al . In the present example, the initial layer 2 is made of a mixture of Al and In.

The temperature of a substrate was set to 380° C. after the substrate was introduced into vacuum equipment, in the same way as in Example 5. Then, Al was evaporated by electron beam evaporation techniques. At the same time, In was evaporated by resistance heating to form the initial layer 2. At this time, the Al/In was 3/2, and the total evaporation rate was 0.05 nm/s for Al and In. The evaporation operation was carried out for 4 seconds. Subsequently, a buffer layer 3 and a semiconductor thin film 4 were formed in the same way as in Example 5.

It was confirmed that the semiconductor thin film 4 was grown epitaxially in the same way as in Example 1. The electron mobilities at room temperature were 4.3 to 4.9 $m^2/V$-s, which were comparable or superior to the values obtained in Example 5. Furthermore, the adhesiveness between the successive layers was good similarly to Example 1. The fabricated Hall-effect devices had quite high reliability in the same manner as in Example 1.

It is to be understood that the conditions under which the initial layer 2 is formed are not limited to the foregoing. The reason will be described below in greater detail in connection with the process of formation.

As described already in Examples 1 and 5, the relation between the thickness of the initial layer 2 on which a film is epitaxially grown and the temperature at which the buffer layer 3 is started to be grown differs between In and Al. In the case of In, the temperature is 250°–350° C. at thicknesses of 0.1 to 2 nm. In the case of Al, the temperature is 250° to 430° C. at thicknesses of 0.1 to 3 nm. In the case of Ga, the temperature is 250°–400° C. at thicknesses of 0.1 to 2 nm as already described in Example 6. Thus, the lower limit of the initial layer and the lower limit of the temperature at which the buffer layer was started to be grown were the same for all the cases and did not differ where the materials were mixed. The upper limits differed among these cases but if the materials are mixed, the upper limits may be set to values determined from the mixture ratio by a simple proportional distribution. In this way, the ratio of mixture can be set at will by controlling the upper and lower limits.

However, if the film is started to be grown at a relatively high temperature within this temperature range, the surface of the buffer layer 3 will be roughened. Therefore, as described already in Examples 6 and 7, it is desired to elevate the temperature after the buffer layer 3 is started to be formed at a low temperature.

As described above, semiconductor thin films 4 having high electron mobilities could be fabricated under various conditions described above. In the present example, the buffer layer 3 is grown while elevating the temperature in the same way as in Example 2 but the present example is not limited to this method similarly to Example 5.

EXAMPLE 8

The manufacturing steps of the present example are similar to the steps of Example 7 except for the manner in which the buffer layer 3 is formed. In Example 7, the layer is made of InSb. In the present example, the composition was shifted from AlInSb to InSb.

An initial layer 2 was formed at a substrate temperature of 380° C. out of Al and In such that the Al:In was 3:2, in the same way as in Example 7. Coevaporation of Al, In, and Sb was started by making use of electron beam evaporation and resistance heating. At this time, the evaporation rate was 0.06 nm/s for Al and 0.04 nm/s for In. The evaporation rate of Sb was maintained at such a value that the ratio of the total number of evaporated Al and In particles to the number of evaporated Sb particles is 2. Under this condition, the substrate temperature was elevated in the same way as in Example 7. The evaporation rate of Al was lowered by 0.01 nm/s and the evaporation rate of In was increased by 0.01 nm/s every 20 seconds while continuing the evaporation process. After a lapse of 120 seconds, only In and Sb were evaporated. The evaporation time, the substrate temperature, and the pressure were the same as those used in Example 7. Subsequently, the semiconductor thin film 4 was formed in the same way as in Example 7.

It was confirmed that the semiconductor thin film 4 was grown epitaxially in the same way as in Example 1. The electron mobilities at room temperature were 4.5 to 5.0 m²/V-s, which were comparable to the values obtained in Example 3. Furthermore, the adhesiveness between the successive layers was good similarly to Example 1. The fabricated Hall-effect devices had quite high reliability in the same manner as in Example 1.

It is to be understood that the conditions under which the initial layer 2 is formed are not limited to the foregoing. The reason will be described below in greater detail in connection with the process of formation.

Where a film of InSb is formed on the initial layer containing Al, a film of AlSb is formed at the boundary. Since the composition changes suddenly at this boundary, misfit dislocations occur, often leading to a deterioration in the crystallinity. In order to prevent this, it is necessary to change the composition mildly. In the present example, therefore, the proportion of Al was reduced gradually. In this method, the lattice constant can be varied gradually from AlInSb to InSb. A semiconductor thin film 4 having good crystallinity and a flat surface can be obtained. The same method is adopted for the case of the initial layer 2 made only of Al and for the case of Ga. A semiconductor thin film 4 of good quality can be derived by gradually changing the composition from the composition of In:Al:Ga of the initial layer 2 to the composition of the semiconductor layer 4.

As described above, semiconductor thin films 4 having high electron mobilities could be fabricated under various conditions described above. In the present example, the buffer layer 3 is grown while elevating the temperature but the present example is not limited to this method similarly to Example 5. In the present example, the ratio of Al to In was changed in a stepwise fashion. It may also be varied continuously.

EXAMPLE 9

In order to increase the sensitivity of a magnetoresistor shown in FIG. 4(a), it is desired to increase the electron mobility. It is known that a method of adding InBi increases the electron mobility of InSb described thus far (Amemiya et al., Trans. I.E.E.J., 93-C, No. 12, (1973), pp. 273–280). In the present example, therefore, the composition of the semiconductor thin film 4 was changed, based on the method of Example 8.

The method of Example 8 was carried out until the buffer layer 3 was formed. Then, the semiconductor thin film 4 was started to be formed by coevaporation of In, Sb, and Bi, utilizing resistance heating. At this time, In and Sb were evaporated under the same conditions. The evaporation rate of Bi was so determined that Bi/In was maintained at 0.02. The evaporation time, the substrate temperature, and the pressure were the same as those used in Example 8.

It was confirmed that the semiconductor thin film 4 was grown epitaxially in the same way as in Example 1. The electron mobilities at room temperature were 4.8 to 5.4 m²/V-s, which were superior to the values obtained in Example 8. Furthermore, the adhesiveness between the successive layers was good similarly to Example 1. The fabricated Hall-effect devices had quite high reliability in the same manner as in Example 1.

It is to be understood that the conditions under which the initial layer 2 is formed are not limited to the foregoing. The reason will be described below in greater detail in connection with the process of formation.

Since the vapor pressure of Bi is lower than the vapor pressure of Sb by about 2 orders of magnitude, Bi does not evaporate again from the film within the range of temperatures at which the semiconductor thin film 4 is formed. Therefore, a desired composition $InSb_{1-x}Bi_x$ is obtained irrespective of the proportion of Sb, by maintaining the In/Bi at a constant value of 1/x. That is, the proportion of Sb, the evaporation rate, and other factors can be set at will merely by setting In/Bi at a desired value. Although the electron mobility can be improved by adding InBi, if the percentage is in excess of 2.6%, then the crystalline structure of InSb changes, thus deteriorating the characteristics. Consequently, the percentage of InBi should be less than this value.

As described above, semiconductor thin films 4 having high electron mobilities could be fabricated under various conditions described above. In the present example, the buffer layer 3 is grown while elevating the temperature in the same way as in Example 2 but the present example is not limited to this method similarly to Example 5.

EXAMPLE 10

In order to increase the sensitivity of a Hall generator shown in FIG. 4(b), the Hall coefficient must be larger than the electron mobility. It is known that the Hall coefficient of InSb is increased by adding GaSb (J. Appl. Phys. Vol. 44, No. 4, 1973, pp. 1625–1630). In the present example, the composition of the semiconductor thin film 4 was varied, based on the method of Example 8 in which the initial layer 2 and the buffer layer 3 contain Al. In the present example, these two layers contain Ga instead of Al.

An initial layer 2 was formed-out of Ga and In such that the Ga:In was 3:2, in the same way as in Example 8. The manufacturing conditions were similar to the conditions of Example 8 except that Al was replaced by Ga. Then, coevaporation of the three elements was started to form the buffer layer 3, in the same way as in Example 8. The evaporation rate was changed by 0.01 nm/s every 20 seconds. Ga:In was varied from 3:2 to 1:9. After a lapse of 100 seconds, the ratio was maintained at 1:9. During the growth of the buffer layer 3, the substrate temperature and the percentage of Sb were the same as those used in Example 8. Thereafter, the same manufacturing steps were effected to form the semiconductor thin film 4. That is, Ga:In was set to 1:9. The evaporation rate of Sb was maintained at such a value that the ratio of the total number of evaporated Ga and In particles to the number of evaporated Sb particles is 2.

It was confirmed that the semiconductor thin film 4 was grown epitaxially in the same way as in Example 1. The Hall coefficient of InSb film of Example 8 at room temperature was 630 cm$^3$/C, while the Hall coefficient of the film 4 of the present example was 950 cm$^3$/C. Furthermore, the adhesiveness between the successive layers was good similarly to Example 1. The fabricated Hall-effect devices had quite high reliability in the same manner as in Example 1.

It is to be understood that the conditions under which the initial layer 2 is formed are not limited to the foregoing. The reason will be described below in greater detail in connection with the process of formation.

Since the vapor pressure of Ga is low similarly to the vapor pressure of In, Ga does not evaporate again from the substrate within the range of temperatures at which the semiconductor thin film 4 is formed. Therefore, a desired composition $In_{1-x}Ga_xSb$ is obtained irrespective of the proportion of Sb or other conditions, by maintaining the In/Ga at a constant value of $(1-x/x)$.

As described above, semiconductor thin films 4 having high electron mobilities could be fabricated under various conditions described above. In the present example, the buffer layer 3 is grown while elevating the temperature in the same way as in Example 2 but the present example is not limited to this method similarly to Example 5.

In the examples described thus far, the semiconductor thin film 4 consists mainly of InSb. A mixed crystal between a single substance of this InSb and InBi or GaSb is used. An epitaxially grown semiconductor thin film 4 having good crystallinity can also be obtained by using a mixed crystal with indium phosphide or indium arsenide.

The substrate is made of a single crystal of Si. A substrate having a surface consisting of a single crystal of Si such as a substrate of the SOI (Si on insulator) structure formed by lamination or ion implantation may also be used.

In the examples described thus far, the initial layer 2, the buffer layer 3, and the semiconductor thin film 4 are formed by vacuum evaporation techniques. If plasma-assisted deposition, ionized-cluster beam deposition, or other method of forming a film utilizing the energy of appropriate plasma, ions, or the like is used, the growth temperature can be lowered further. Furthermore, a semiconductor thin film having good characteristics can be fabricated.

What is claimed is:

1. A method of fabricating a semiconductor thin film, comprising the steps of:

preparing a substrate having a surface including a single crystal of Si;

removing an oxide film from the surface of the substrate and terminating dangling bonds of Si atoms on the surface with hydrogen atoms;

forming an initial layer of at least one member selected from the group consisting of Al, Ga, and In on the substrate terminated with the hydrogen atoms;

forming a buffer layer containing at least In and Sb on the initial layer; and forming a semiconductor thin film containing at least In and Sb on said buffer layer at a temperature higher than a temperature at which said buffer layer is started to be formed.

2. The method in accordance with claim 1, wherein (A) said initial layer is formed of Al to a thickness of 0.1 to 3 nm;

(B) said buffer layer is started to be formed at a temperature of 250°–430° C.; and (C) said semiconductor thin film is formed at a temperature of 370°–460° C. higher than said temperature at which said buffer layer is started to be formed.

3. The method in accordance with claim 1, wherein (A) said initial layer is formed of Ga to a thickness of 0.1 to 2 nm;

(B) said buffer layer is started to be formed at a temperature of 250°–400° C.; and (C) said semiconductor thin film is formed at a temperature of 370°–460° C. higher than said temperature at which said buffer layer is started to be formed.

4. The method in accordance with claim 1, wherein (A) said initial layer is formed out of In to a thickness of 0.1 to 2 nm;

(B) said buffer layer is started to be formed at a temperature of 250°–350° C.; and (C) said semiconductor thin film is formed at a temperature of 370°–460° C.

5. The method in accordance with claim 1, wherein said buffer layer consists of In and Sb.

6. The method in accordance with claim 1, wherein said buffer layer includes Al, In, and Sb, and wherein said Al has a proportion decreasing with increasing thickness of said buffer layer.

7. The method in accordance with claim 1, wherein said buffer layer includes Ga, In, and Sb.

8. The method in accordance with claim 1, wherein a proportion of Al, In, and Sb of the buffer layer varies continuously or in a stepwise fashion from an interface with said initial layer to an interface with said semiconductor thin film, from a proportion of those of the initial layer to a proportion of those of the semiconductor thin film.

9. The method in accordance with claim 1, wherein said buffer layer is formed while maintaining said temperature at which said buffer layer is started to be formed.

10. The method in accordance with claim 7, wherein said buffer layer is formed in such a way that a ratio of a number of evaporated Sb particles to a number of evaporated In particles is increased with increasing thickness of said buffer layer and then the temperature of said substrate is elevated at least to 370° C. at a rate exceeding 0.5° C./sec.

11. The method in accordance with claim 1, wherein said buffer layer is formed in such a way that the temperature of said substrate is elevated with increasing thickness of said buffer layer.

12. The method in accordance with claim 1, wherein said buffer layer is formed in such a way that the temperature of said substrate is descended with increasing thickness of the buffer layer and then the substrate is elevated at least to 370° C. at a rate exceeding 0.5° C./sec.

13. The method in accordance with claim 1, wherein said semiconductor thin film consists only of indium antimonide or consists of a mixed crystal between indium antimonide and at least one member selected from the group consisting of indium phosphide, indium arsenide, indium bismuthide, and Ga antimonide.

14. The method in accordance with claim 1, further including the step of attaching electrodes to said semiconductor thin film.

15. The method in accordance with claim 1, further including the step of attaching electrodes to said semiconductor thin film so as to produce a hall-effect device.

* * * * *